United States Patent
Sanada

[11] Patent Number: 5,985,357
[45] Date of Patent: Nov. 16, 1999

[54] TREATING SOLUTION SUPPLYING METHOD AND APPARATUS

[75] Inventor: Masakazu Sanada, Kyoto, Japan

[73] Assignee: Dainippon Screen Mfg. Co., Ltd., Japan

[21] Appl. No.: 09/013,113

[22] Filed: Jan. 26, 1998

[30] Foreign Application Priority Data

Jan. 28, 1997 [JP] Japan .................................. 9-013032

[51] Int. Cl.$^6$ .............................. B05D 3/12; B05C 11/02
[52] U.S. Cl. .............................. 427/8; 427/240; 118/696; 118/697; 118/712; 118/52; 118/320
[58] Field of Search ....................... 427/240, 8; 118/696, 118/697, 712, 52, 320

[56] References Cited

U.S. PATENT DOCUMENTS

| | | | |
|---|---|---|---|
| 4,451,507 | 5/1984 | Beltz et al. | 427/240 |
| 5,500,243 | 3/1996 | Yang | 427/240 |
| 5,843,527 | 12/1998 | Sanada | 427/240 |

*Primary Examiner*—Katherine A. Bareford
*Attorney, Agent, or Firm*—Ostrolenk, Faber, Gerb & Soffen, LLP

[57] ABSTRACT

A method of supplying a treating solution based on a prestored processing program with a plurality of instructions including a supply start instruction and a supply stop instruction for performing a series of processes. The method includes the steps of executing the supply start instruction to supply the treating solution to a central region of a substrate, executing the supply stop instruction to stop supplying the treating solution when the treating solution has been supplied in a fixed quantity/and executing subsequent instructions in the processing program in response to an actual stoppage in delivering the treating solution following execution of the supply stop instruction.

28 Claims, 11 Drawing Sheets

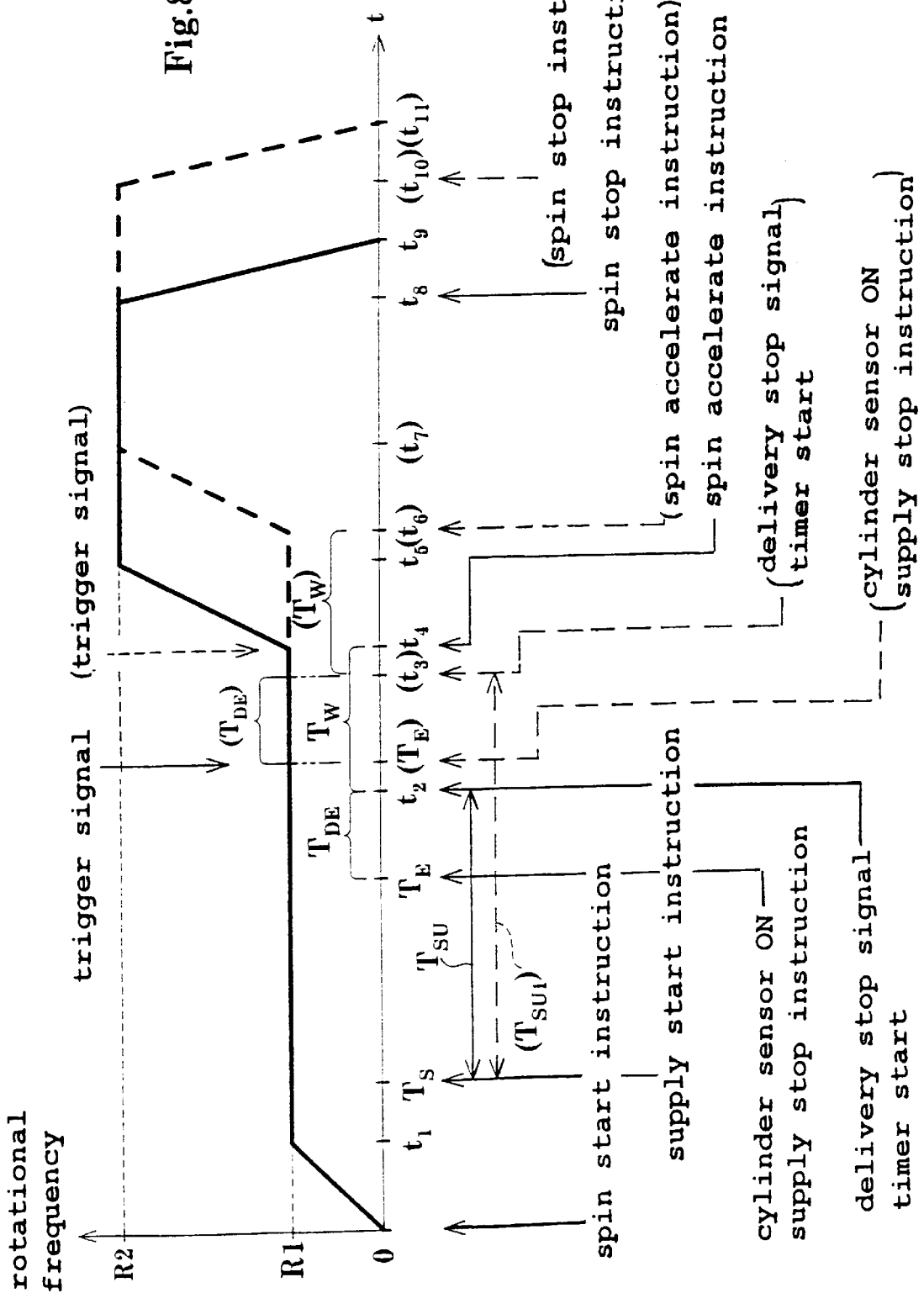

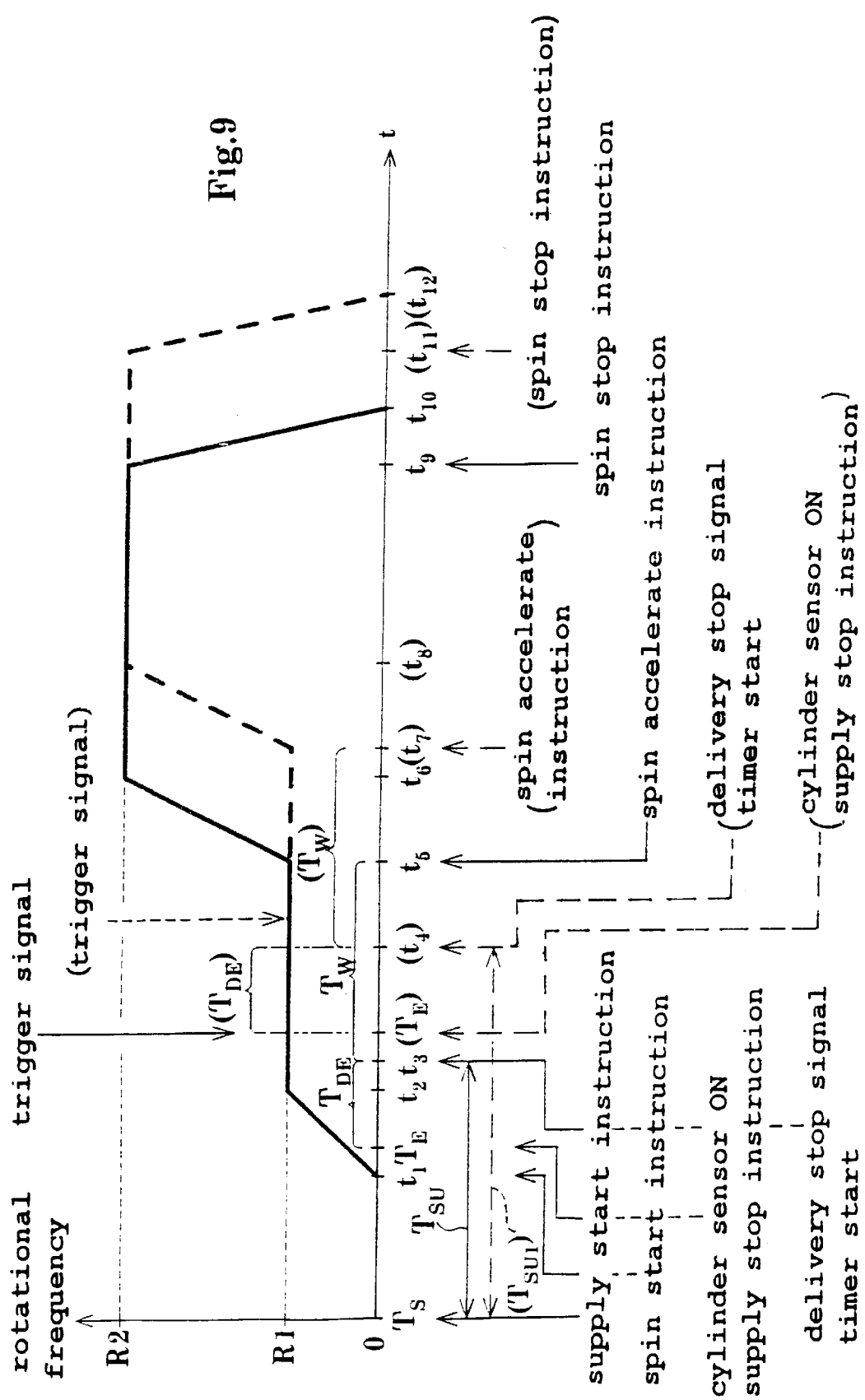

TREATING SOLUTION SUPPLYING METHOD AND APPARATUS

BACKGROUND OF THE INVENTION (1) Field of the Invention

This invention relates to methods and apparatus for supplying a treating solution such as photoresist or developer to substrates such as semiconductor wafers, glass substrates for photomasks, glass substrates for liquid crystal displays or glass substrates for optical disks (hereinafter referred to simply as substrates or as wafers). More particularly, the invention relates to a technique of treating the surface of each substrate by supplying a treating solution in a predetermined fixed quantity thereto based on a prestored processing program with a plurality of instructions including a supply start instruction and a supply stop instruction for performing a series of processes.

(2) Description of the Related Art

A conventional treating solution supplying method of the type noted above will be described with reference to a time chart shown FIG. 1.

This time chart corresponds to a processing program (also called a spin coat program or recipe) prepared beforehand in accordance with a desired film thickness and the like. At a point of time $T_S$ at which a substrate remains still, for example, a supply start instruction is executed to start supplying a photoresist solution as a treating solution. At a point of time $T_E$ when a predetermined supplying period $T_{SU}$ elapses, a supply stop instruction is executed to stop supplying the photoresist solution. The above method in which the photoresist supply is started and stopped while the substrate is maintained still is hereinafter called the "static method".

At a point of time ti which is a predetermined period after stopping the photoresist supply to the substrate as noted above, the substrate is spun with an acceleration to a first rotational frequency R1 (e.g. 900 rpm). The spin at the first rotational frequency R1 is maintained for a predetermined period whereby the photoresist solution is spread substantially over the entire surface of the substrate. Next, the substrate is spun at a second rotational frequency R2 (e.g. 3,000 rpm) higher than the first rotational frequency R1 for a predetermined period. Consequently, the photoresist solution is spread completely over the entire surface of the substrate, and a superfluous part of the photoresist solution is dispelled, thereby forming a photoresist film of desired thickness uniformly over the entire surface of the substrate.

A mechanism for supplying the photoresist solution, e.g. a pump for feeding the photoresist solution to a nozzle, usually includes a filter disposed at an output side thereof. This filter is provided primarily for the purpose of protecting substrates from contamination when impurities are contained in the photoresist solution. However, an increasing pressure loss occurs across the filter as its mesh becomes clogged through use, for example. Such an increasing pressure loss results in a reduced flow velocity of the photoresist solution supplied. Then, even if the pump is driven for the predetermined supplying period $T_{SU}$ to supply the photoresist solution as noted above, the photoresist solution is supplied during the supplying period $T_{SU}$ in a quantity less than what is intended. Inconveniences are encountered where, as days go by, substrate treatment based on the processing program fails to form films of uniform thickness or of desired thickness.

There has been an ever-intensifying movement recently, with a view to a reduction in the cost of manufacturing semiconductor devices, environmental protection and so on, to limit to a necessity minimum the supply of photoresist solution which was formerly was supplied in a lavish way, thereby to minimize the quantity of photoresist solution dispelled and discarded (the movement being called resist saving also). Such resist saving could give rise to the worst situation where the surface of a substrate is not fully covered by the photoresist solution supplied in a reduced quantity.

The following method has been proposed to solve the problem experienced with the above method based on supplying the photoresist solution at a fixed flow velocity.

That is, the quantity of photoresist solution fed by the pump is controlled to supply the photoresist solution constantly in a predetermined quantity. By controlling the quantity of supply in place of the control based on the photoresist supplying period, the photoresist solution may be supplied in the predetermined quantity to the substrate despite an increased pressure loss. Thus, the photoresist solution may be supplied in a predetermined fixed quantity over a long period of time, to avoid the inconvenience due to energy saving noted above.

However, this conventional method has the following drawback.

The photoresist supply is started at the point of time $T_S$ for executing the supply start instruction, and stopped at the point of time $T_E$ for executing the supply stop instruction when the photoresist solution has been supplied in a predetermined fixed quantity. The supplying period $T_{SU}$ between these instructions becomes extended due to pressure loss increases occurring with passage of some days. This results in shortening of the intended period from the point of time $T_E$ for stopping the photoresist supply on the supply stop instruction to the point of time ti for starting a substrate spin. In an extreme case, the supply period is extended to a period ($T_{SU1}$) as indicated in a dotted line in FIG. 1, so that the photoresist supply is stopped after the substrate is started spinning. This is contrary to the intended processing method, i.e. the "static method", in which the photoresist supply should be completed while the substrate remains still prior to a spin.

The processing program is prepared through experiment using dummy substrates with the same surface condition as product substrates. The experiment is repeated by varying conditions such as timing of starting and stopping the photoresist supply, rotational frequencies R1 and R2, and the periods for maintaining the rotational frequencies R1 and R2. The program is based on optimal conditions found through the experiment to form films of desired thickness, and that uniformly over the entire surface of each substrate. Thus, in the event of any mistiming, the substrate is treated in a way deviating from the optimum conditions set by the program.

Methods of supplying the photoresist solution other than the above "static method" include a method in which the supply start instruction is executed while the substrate is spun at the first rotational frequency R1, and the supply stop instruction is executed to complete the supply when the photoresist solution has been supplied in a fixed quantity (which is hereinafter called the "dynamic method"), and a method in which the supply start instruction is executed while the substrate remains still, and the supply stop instruction is executed, when the photoresist solution has been supplied in a fixed quantity, to complete the supply after the substrate is spun with an acceleration to the first rotational frequency R1. The latter is a combination of the "static method" and "dynamic method", and will be called "stamic method" hereinfter.

In the "dynamic method" and "stamic method", an extended supplying period results in shortening of the period between the point of time for stopping the photoresist supply and the point of time for starting to accelerate the spin to the second rotational frequency R2. Thus, as in the "static method", the substrate is treated in a way deviating from the optimum conditions.

SUMMARY OF THE INVENTION

This invention has been made having regard to the state of the art noted above, and its object is to provide a treating solution supplying method and apparatus capable of performing a treatment based on a processing program accurately over a long period of time by executing instructions in the processing program in response to a stoppage in delivering a treating solution.

The above object is fulfilled, according to this invention, by a method of supplying a treating solution based on a prestored processing program with a plurality of instructions including a supply start instruction and a supply stop instruction for performing a series of processes, the method comprising the steps of:

(a) executing the supply start instruction to supply the treating solution to a region centrally of a substrate;

(b) executing the supply stop instruction to stop supplying the treating solution when the treating solution has been supplied in a fixed quantity; and (c) executing subsequent instructions in the processing program in response to an actual stoppage in delivering the treating solution following execution of the supply stop instruction.

With the prestored processing program providing a series of processes, the treating solution begins to be supplied to the substrate by execution of the supply start instruction included in the program. The supply of the treating solution is stopped by the supply stop instruction executed when the treating solution has been supplied in a fixed quantity. When, for example, the flow velocity of the treating solution lowers during its supply, the supply stop instruction is executed with a delay in order to supply the treating solution in the predetermined fixed quantity. Subsequent instructions in the processing program are executed in response to an actual stoppage in the delivery of the treating solution following execution of the supply stop instruction. Consequently, the instructions after the supply stop instruction are executed with a delay corresponding to the execution timing of the supply stop instruction. The transition to the instructions following the supply stop instruction may be made dependent on the point of time at which the delivery of the treating solution is actually stopped. Thus, the period from the stoppage in the delivery to the execution of a next instruction may be fixed at all times.

As noted above, after the supply stop instruction is executed, subsequent instructions are executed in response to an actual stoppage in the delivery of the treating solution. The transition to the instructions following the supply stop instruction may be made dependent on the point of time at which the delivery of the treating solution is actually stopped. Thus, even if the flow velocity of the treating solution lowers during its supply to delay execution of the supply stop instruction, the period from the stoppage in the delivery to the execution of a next instruction may be fixed at all times. As a result, an intended treatment may be carried out for the substrate accurately over a long period of time, based on the processing program prepared beforehand. Photoresist saving may also be achieved advantageously to minimize consumption of the photoresist solution.

In the method according to this invention, preferably, the steps (a) and (b) are executed while the substrate is maintained stationary.

In this supplying method (i.e. the "static method") in which the supply start instruction and the supply stop instruction are executed while the substrate is maintained stationary, a spin start instruction is executed after execution of the supply stop instruction to start the substrate to spin to spread the treating solution substantially over the entire surface of the substrate. Also when this supplying method is employed, the period from the stoppage in the delivery to the execution of a next instruction (i.e. the instruction to start a spin) may be fixed at all times.

The steps (a) and (b) may be executed while the substrate is spun by execution of a spin start instruction included in the processing program.

In this supplying method (i.e. the "dynamic method") in which the supply start instruction and the supply stop instruction are executed while the substrate is in a spin, a spin accelerate instruction is executed after execution of the supply stop instruction to increase the rotational frequency to dispel superfluous treating solution spread substantially over the entire surface of the substrate. Also when this supplying method is employed, the period from the stoppage in the delivery to the execution of a next instruction (i.e. the instruction to accelerate the spin) may be fixed at all times.

In a further preferred embodiment, the step (a) is executed while the substrate is maintained stationary, and the step (b) is executed after the substrate is started spinning by execution of a spin start instruction included in the processing program.

In this supplying method (i.e. the "stamic method") in which the supply start instruction is executed while the substrate is maintained still, and the supply stop instruction is executed after the substrate is started spinning, a spin accelerate instruction is executed after execution of the supply stop instruction to increase the rotational frequency to dispel a superfluous part of the treating solution spread substantially over the entire surface of the substrate. Also when this supplying method is employed, the period from the stoppage in the delivery to the execution of a next instruction (i.e. the instruction to accelerate the spin) may be fixed at all times.

In a further aspect of this invention, an apparatus is provided for supplying a treating solution based on a prestored processing program with a plurality of instructions including a supply start instruction and a supply stop instruction for performing a series of processes, the apparatus comprising:

a rotary support for supporting and spinning a substrate;

a treating solution supplying device for supplying the treating solution to the substrate;

a delivery stop detecting device for detecting an actual stoppage in delivering the treating solution from the treating solution supplying device; and a control device for executing the supply start instruction to supply the treating solution from the treating solution supplying device to a region centrally of the substrate, executing the supply stop instruction to stop supplying the treating solution when the treating solution has been supplied in a fixed quantity, and executing subsequent instructions in response to a detection by the delivery stop detecting device of a stoppage in delivering the treating solution.

When the control device executes the supply start instruction, the treating solution begins to be supplied from the treating solution supplying device to the substrate supported by the rotary support. The supply of the treating solution is stopped by the supply stop instruction executed when the treating solution has been supplied in a fixed quantity. When, for example, the flow velocity of the treating solution lowers during its supply from the treating solution supplying device, the supply stop instruction is executed with a delay in order to supply the treating solution in the predetermined fixed quantity. Subsequent instructions are executed in response to an actual stoppage in the delivery of the treating solution following execution of the supply stop instruction. Consequently, the instructions after the supply stop instruction are executed with a delay corresponding to the execution timing of the supply stop instruction. Execution timing of the instructions after the supply stop instruction may be made dependent on the point of time at which the delivery of the treating solution is stopped. Thus, the period from the stoppage in the delivery to the execution of a next instruction may be fixed at all times.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 8 is a time chart showing a coating process by the dynamic method;

FIG. 9 is a time chart showing a coating process by the stamic method;

DESCRIPTION OF THE PREFERRED EMBODIMENTS

Preferred embodiments of the present invention will be described in detail hereinafter with reference to the drawings.

Figure 1:
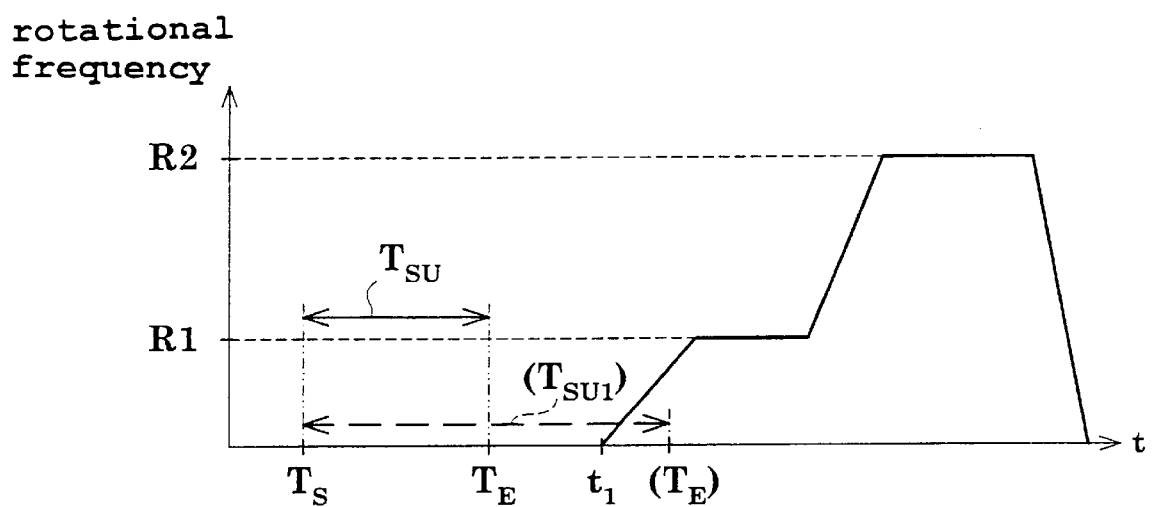
FIG. 1 is a time chart showing a conventional treating solution supplying method (static method)
Figure 2:
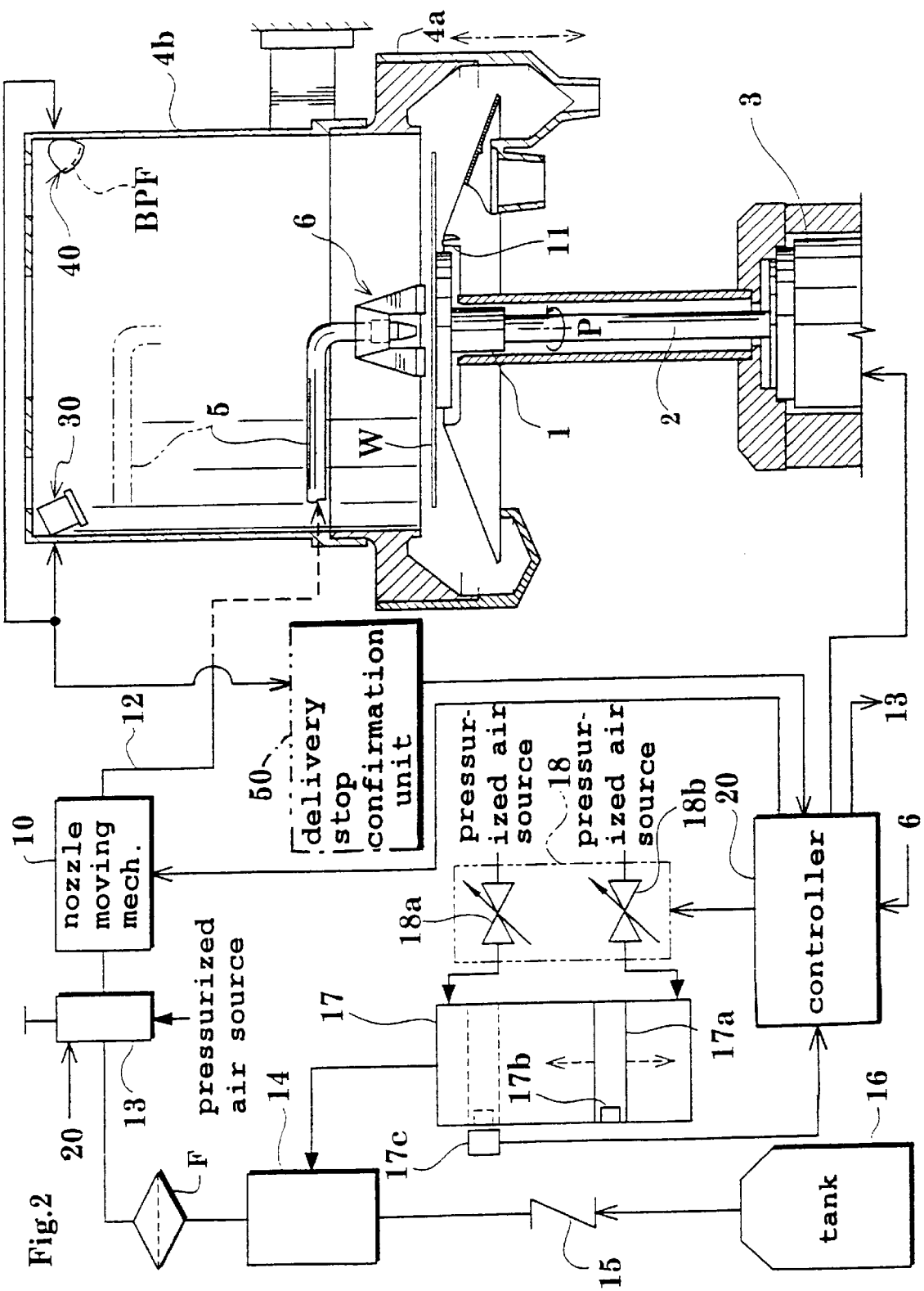
FIG. 2 is a block diagram showing an outline of a substrate spin coating apparatus which is one example of treating solution supplying apparatus according to the present invention.

FIG. 2 is a block diagram showing an outline of a substrate spin coating apparatus (also called a spin coater) which is one example of a treating solution supplying apparatus according to the present invention.

Reference numeral 1 in FIG. 2 denotes a suction type spin chuck for suction-supporting a wafer W in a substantially horizontal posture. The spin chuck 1, which corresponds to the rotary support, is attached to a rotary shaft 2 to be rotatable by an electric motor 3. Thus, the wafer W is spun in the substantially horizontal posture about a spin center P. The electric motor 3 is operable under control of a controller 20 described hereinafter.

The spin chuck 1 is surrounded by a scatter preventive cup 4a for preventing a treating solution such as a photoresist solution and a cleaning solution used for cleaning the back side surface of wafer W, from scattering to the ambient. An upper lid 4b fixed to a stationary frame of the apparatus extends over an upper opening of the scatter preventive cup 4a. The upper lid 4b defines a plurality of openings in an upper region thereof for receiving downflows. When a transport mechanism not shown places untreated wafer W on the spin chuck 1 or removes treated wafer W from the spin chuck 1, a lift mechanism not shown lowers only the scatter preventive cup 4a away from the upper lid 4b, whereby the spin chuck 1 projects upward through the upper opening of the scatter preventive cup 4a. Alternatively, the upper lid 4b and rotary shaft 2 may be raised, by a lift mechanism not shown, relative to a fixed scatter preventive cup 4b. The suction type spin chuck 1 may be replaced by a different type of spin chuck (known as a mechanical spin chuck) for contacting and supporting peripheries of wafer W.

Figure 3:
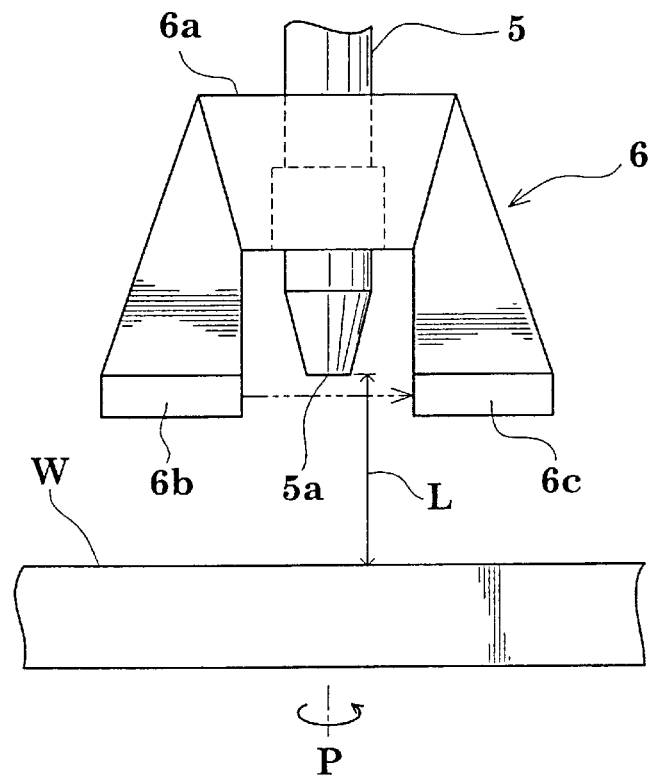
FIG. 3 is a view showing a delivery detecting sensor.

A treating solution supply nozzle 5 is disposed laterally of the scatter preventive cup 4a to be movable between a supply position, on the spin center P and above the wafer W placed on the spin chuck 1, and a standby position retracted sideways from the wafer W. The supply nozzle 5 has a delivery stop detecting sensor 6, which corresponds to the delivery stop detecting device of the present invention, attached to a downwardly extending tip portion thereof. As shown in FIG. 3, the sensor 6 includes a light projector 6b and a light receiver 6c attached to the tip portion of the supply nozzle 5 through a mounting element 6a. The light projector 6b and light receiver 6c are opposed to each other across the supply nozzle 5. Light in the infrared wavelength region projected from the light projector 6b enters the light receiver 6c containing a photodiode sensitive to the infrared wavelength region and thereabouts.

In this apparatus, for example, the delivery stop detecting sensor 6 outputs a detection signal which is turned on when the light is received. Thus, the detection signal is turned off when the photoresist solution is delivered through a discharge opening 5a of the supply nozzle 5, and turned on when the photoresist solution ceases to be delivered. When the level of the detection signal changes from "off" to "on", a "delivery stop signal" is outputted to the controller 20.

The treating solution supply nozzle 5 is movable by a nozzle moving mechanism 10 between the supply position and standby position. In the supply position, as shown in FIG. 3, the discharge opening 5a of the nozzle 5 is located at a distance L upward from the surface of wafer W. The distance L is approximately 4mm, for example. Preferably, this distance is set according to the viscosity of the photoresist solution, size of wafer W and surface condition of wafer W, to avoid irregularities occurring when the photoresist solution dripped to the surface of wafer spreads over the entire surface.

Further, back rinse nozzles 11 are arranged inside the scatter preventive cup 4a and below the wafer W for delivering a cleaning solution toward the backside surface of wafer W to remove unwanted photoresist solution scattering in a mist and adhering to the backside surface or flowing round to the backside surface. The back rinse nozzles 11 deliver the cleaning solution under the control of the controller 20 described hereinafter.

The treating solution supply nozzle 5 is connected through a supply pipe 12, a suckback valve 13, a filter F, a bellows pump 14 and a check valve 15 to a treating solution tank 16 for storing the photoresist solution. The suckback valve 13 is operable by pressurized air fed thereto from a pressurized air source which is one of the utilities installed in a cleanroom. With this operation, part of the photoresist solution remaining in the tip portion of the supply nozzle 5 is slightly drawn back to prevent inadvertent dripping onto the wafer W and curing of the photoresist solution exposed from the discharge opening 5a. When the pressurized air is exhausted therefrom, the suckback valve 13 becomes inoperative, i.e. cancels the action to draw the photoresist solution back from the supply nozzle 5. The feeding and exhaustion of the pressurized air to/from the suckback valve 13 are controlled by electric signals outputted from the controller 20. The suckback valve 13 performs the suckback action with an adjustable pressure. Even if the suckback pressure is fixed, operating speeds of the suckback valve 13 in drawing back the photoresist solution and in canceling the action after input of the electric signals may be variable to some extent, for example, with the pressure of the pressurized air source.

The filter F is provided primarily for the purpose of protecting the wafer W from contamination when impurities are contained in the photoresist solution stored in the treating solution tank 16. Naturally, a pressure loss occurs across the filter F even if the filter F is new. The pressure loss increases gradually as days go by.

The bellows pump 14 is operable by a double-acting air cylinder 17 causing the photoresist solution to flow from the treating solution tank 16 into the supply pipe 12. The check valve 15 prevents the photoresist solution from flowing back to the tank 16 at this time. The double-acting air cylinder 17 is operable by pressurized air supplied from the pressurized air source through a speed control valve assembly 18. The valve assembly 18 includes speed control valves 18a and 18b for supplying and exhausting the pressurized air to/from the two spaces partitioned by a piston 17a, to drive the piston 17a up and down.

The double-acting air cylinder 17 is constructed to detect vertical positions of the piston 17a. Specifically, a magnet 17b embedded in an outer peripheral position of the piston 17a is detected by a cylinder sensor 17c attached to an outer side surface of the double-acting air cylinder 17 and in a selected position in the direction of movement of the piston 17a. The cylinder sensor 17c is in the form of a magnetic sensor for detecting the magnetism of magnet 17b. When the magnetism is detected, the detection signal of cylinder sensor 17c is turned on, for example. The detection signal is outputted from the cylinder sensor 17c to the controller 20. The position of cylinder sensor 17c is appropriately adjusted according to the quantity of photoresist solution to be supplied to the wafer W.

As noted hereinbefore, the flow velocity of the photoresist solution lowers with an increase in the pressure loss across the filter F. Consequently, even if the double-acting air cylinder 17 is operated to drive the bellows pump 14 for a fixed period of time, the bellows pump 14 can feed only a reduced quantity of photoresist solution into the supply pipe 12. The photoresist solution cannot be supplied in a fixed quantity to the wafer W. Thus, instead of supplying the photoresist solution by time control, this apparatus employs a control method based on supply quantity. That is, the double-acting air cylinder 17 is driven until the cylinder sensor 17c is turned on, whereby the photoresist solution is supplied in a fixed quantity despite an increase in the pressure loss across the filter F.

The speed control valve assembly 18 is operable by an electric signal from the controller 20 to feed pressurized air from the pressurized air source to the double-acting air cylinder 17, and is made inoperative by the electric signal to exhaust the pressurized air from the air cylinder 17. The valve assembly 18 is manually adjustable to adjust flow rates of the pressurized air supplied from the pressurized air source and exhausted from the air cylinder 17. The operating speed of the air cylinder 17 is variable with the degree of pressure adjustment and the pressure of the pressurized air source. This results in an adjustment of operation of the bellows pump 14, i.e. the speed of its operation to supply or stop the photoresist solution from the supply nozzle 5. The supply nozzle 5, supply pipe 12, filter F, bellows pump 14, check valve 15, treating solution tank 16, double-acting air cylinder 17 and speed control valve assembly 18 constitute the treating solution supplying device of this invention.

The controller 20 corresponding to the control device of this invention includes a clock, internal timer and RAM not shown. The RAM stores a processing program and the like prepared with optimal conditions for a desired processing found through experiment repeated by varying conditions. This processing program is executed based on the clock and internal timer. Among a plurality of instructions included in the processing program, as described in detail hereinafter, after a supply stop instruction is executed to stop the photoresist solution delivered through the treating solution supply nozzle 5, a next instruction is executed in response to the "delivery stop signal" outputted from the delivery stop detecting sensor 6. In other words, after execution of the supply stop instruction, execution of the next instruction is prohibited until the "delivery stop signal" is outputted.

The upper lid 4b includes a CCD camera 30 attached to a left inner periphery thereof, and a strobe 40 attached to a right inner periphery. The CCD camera 30 includes a CCD acting as a solid-state image sensor, an electronic shutter and a lens. Its field of view covers a region around the spin center of wafer W including a spacing between the discharge opening 5a of the treating solution supply nozzle 5 and the surface of wafer W, i.e. including a position in which the photoresist solution delivered from the supply nozzle 5 reaches the wafer W. It appears from FIG. 2 as if a horizontally extending portion of the supply nozzle 5 blocked the view of the region around the spin center of wafer W. However, the CCD camera 30 and the supply nozzle 5 are staggered sideways from each other to enable imaging of the region around the spin center including the above-mentioned spacing. The strobe 40 is used to illuminate the wafer W for image pickup since the apparatus per se is installed in a darkroom to prevent exposure of the photoresist solution. The strobe 40 may be designed suitably according to the spectral sensitivity of the photoresist solution to avoid its exposure. This embodiment employs a combination of a xenon lamp and a band-pass filter BPF which passes wavelengths of 500 nm and above. The strobe 40 may employ a high intensity infrared light emitting diode or an infrared light emitting diode array having spectral sensitivity to the infrared and adjacent regions. Then, the band-pass filter BPF may be omitted. The CCD camera 30 and strobe 40 are connected to a delivery stop confirmation unit 50.

Figure 4:
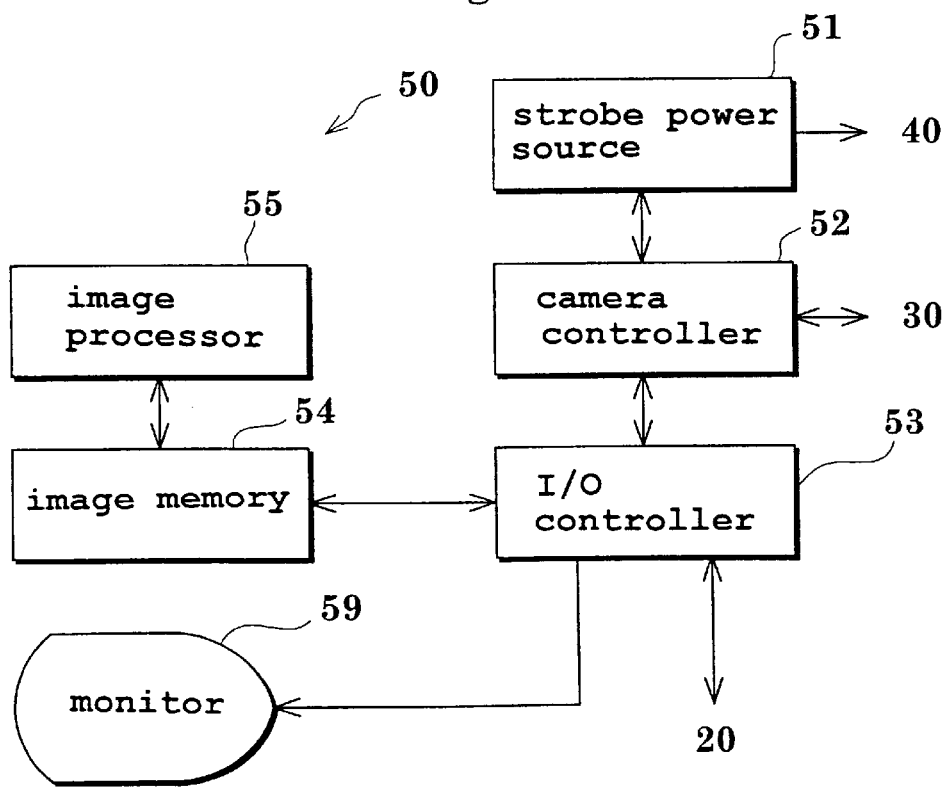
FIG. 4 is a block diagram of a delivery stop confirmation unit.

The delivery stop confirmation unit 50 will be described with reference to FIG. 4.

The strobe 40 is continuously lit by a predetermined supply of power from a strobe power source 51. The operation, e.g. image pickup timing, of CCD camera 30 is determined by the electric shutter operable under control of a camera controller 52. An image pickup instruction is given to the camera controller 52 from an I/O controller 53 which receives a trigger signal from the controller 20, whereupon the CCD camera 30 is operated to pick up an image of the surface of wafer W. Image signals of the wafer surface are transmitted through the camera controller 52 and I/O controller 53 to an image processor 54 to be stored as a still picture in an image memory 55. The strobe power source 51 need not supply power to the strobe 40 continuously. The strobe 40 may be lit intermittently only for appropriate periods of time including image pickup periods. Preferably, the CCD camera 30 has a field of view determined by taking the speed of this image processing into account.

The image processor 54 outputs the still picture in the image memory 55 to a monitor 59 through the I/O controller 53. The operator observes the still picture displayed on the monitor 59, and decides whether a delivery stoppage is detected properly or not. An unsatisfactory still picture indicates that the delivery stop detecting sensor 6 is functioning improperly, for example. Then, the operator can manually stop the operation of the apparatus. In this way, an improper processing is precluded from being applied to all succeeding wafers.

Figure 5:
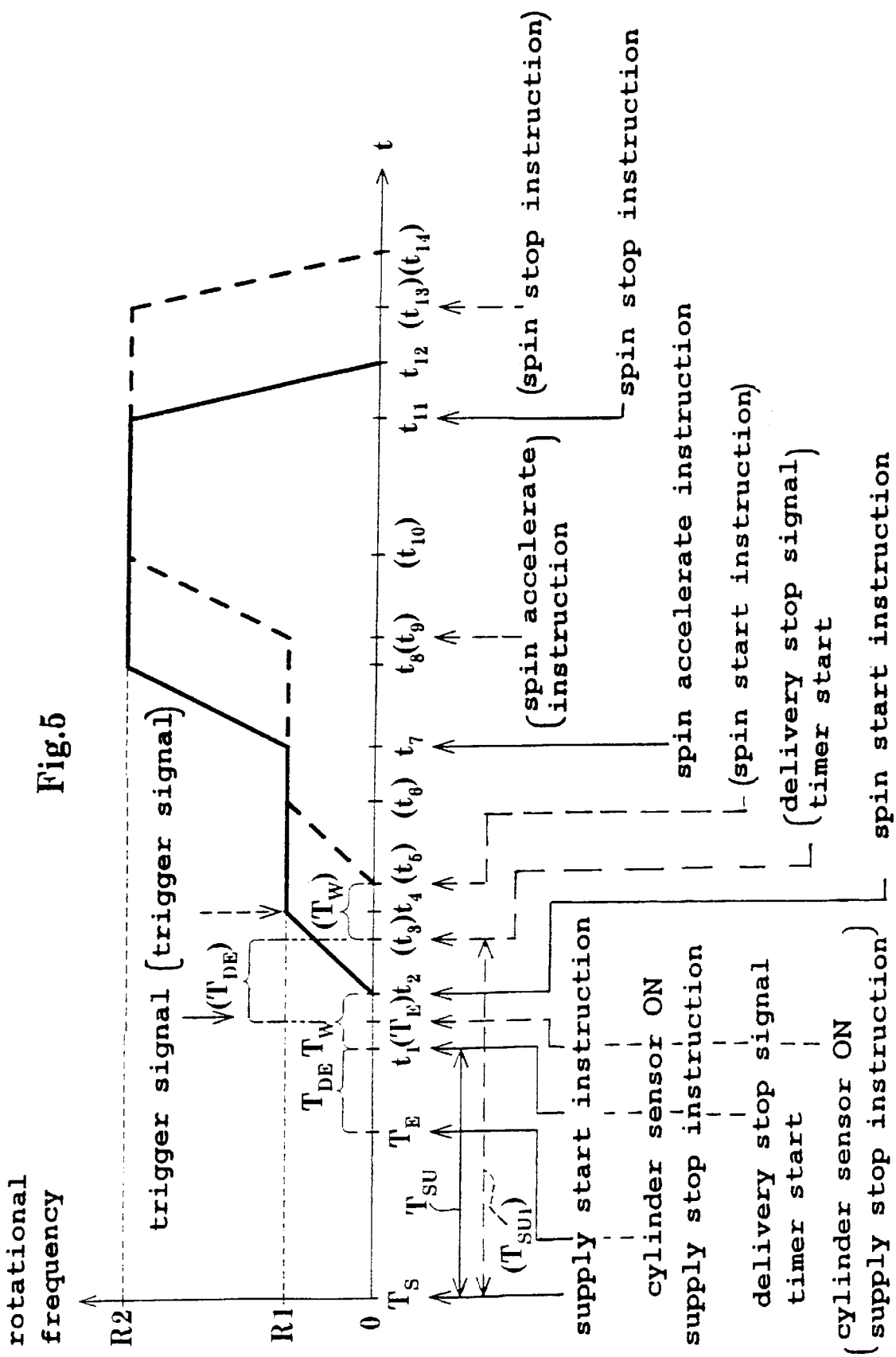
FIG. 5 is a time chart showing a coating process by the static method.
Figure 6:
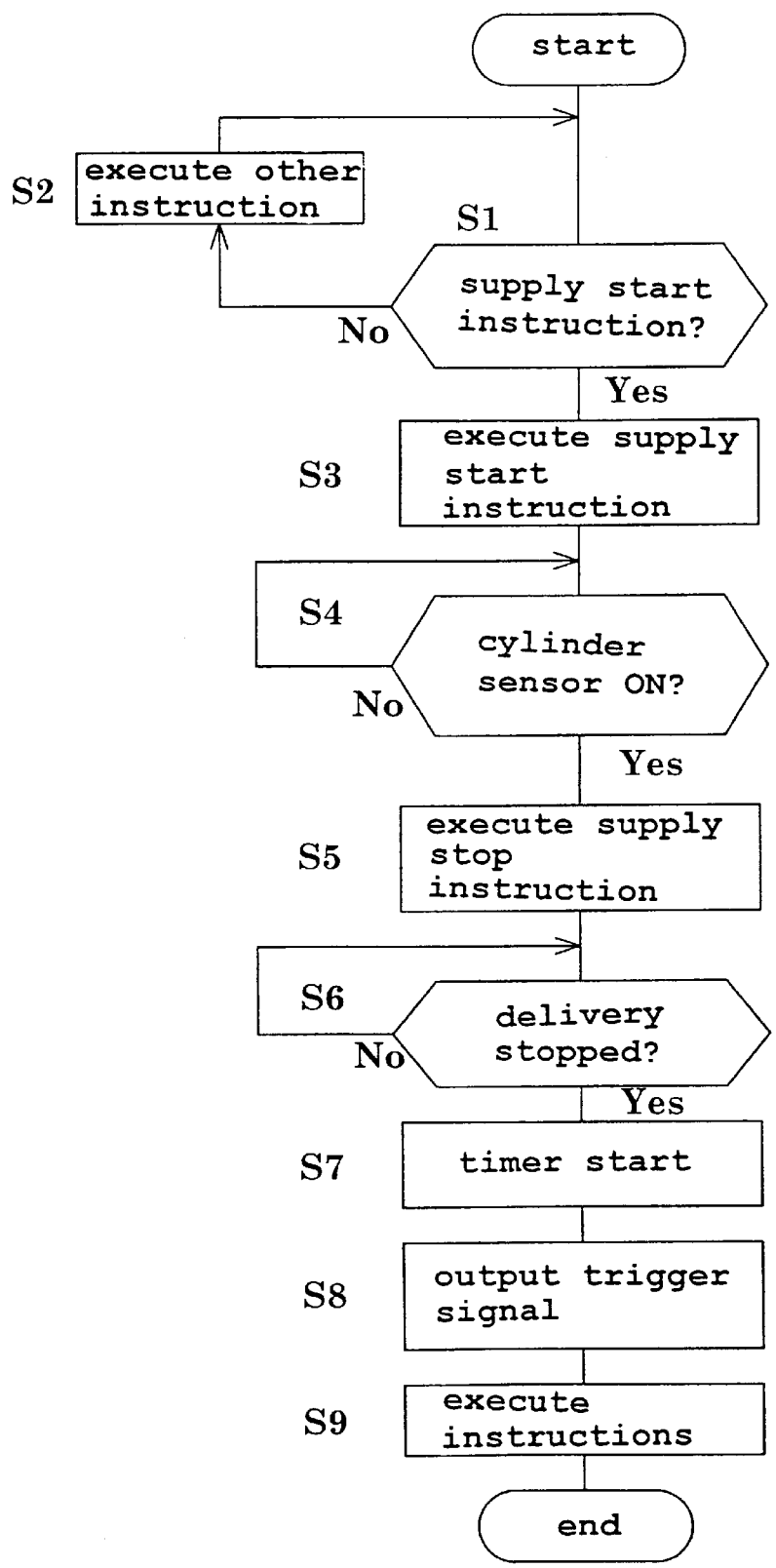
FIG. 6 is a flow chart showing an operation of a controller.

Next, an operation of the apparatus will be described with reference to FIGS. 5 through 7. FIG. 5 is a time chart of the processing program for performing a coating process. FIG. 6 is a flow chart showing an operation of the controller 20.

Figure 7:
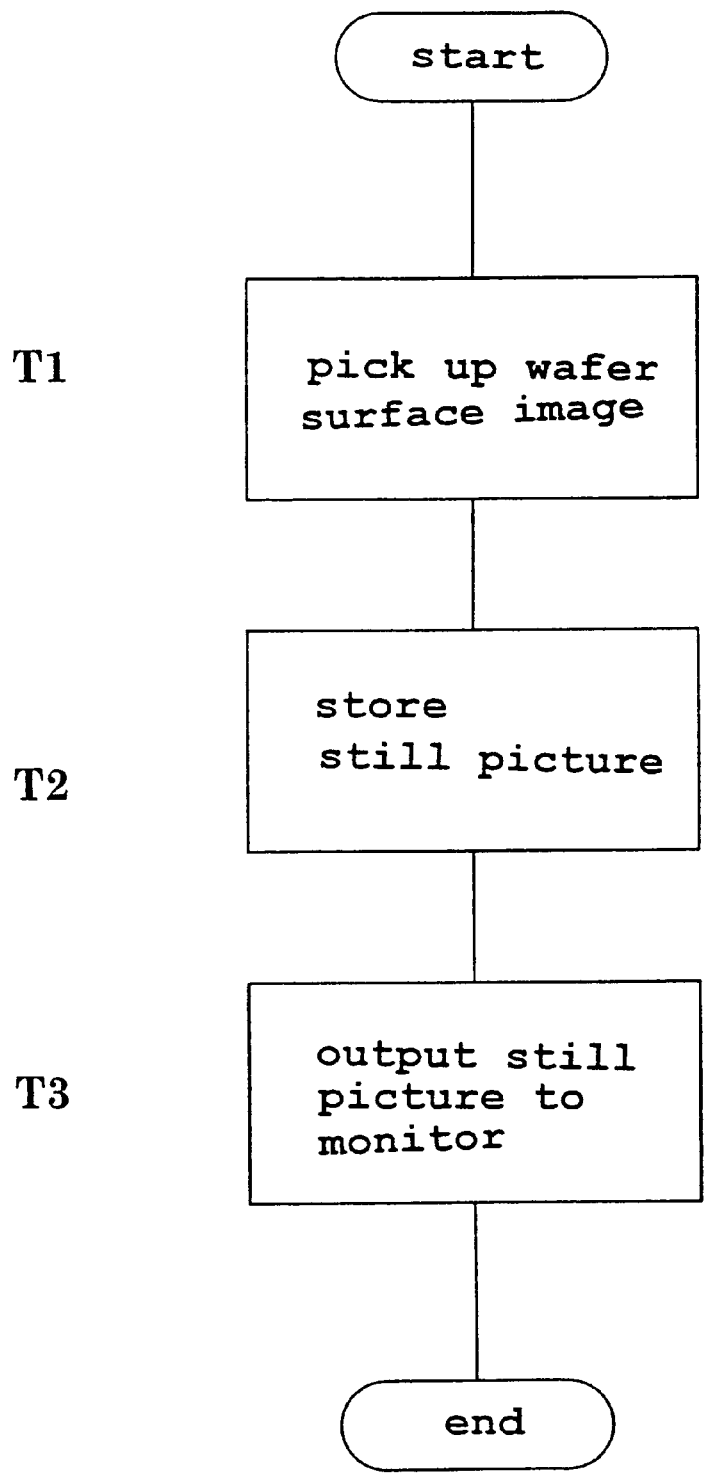
FIG. 7 is a flow chart showing an operation of the delivery stop confirmation unit.

FIG. 7 is a flow chart showing an operation of the delivery stop confirmation unit 50.

The following description will be made on the assumption that wafer W is already placed on the spin chuck 1 by the substrate transport mechanism not shown, and is suction-supported by the spin chuck 1. It is further assumed that the treating solution supply nozzle 5 has been moved to the supply position (shown in solid lines in FIG. 2) by the nozzle moving mechanism 10, with the discharge opening 5a situated at distance L above the wafer W.

Methods of supplying the photoresist solution include the "static method" in which a supply start instruction is executed to start photoresist supply while the wafer W remains still, and a supply stop instruction is executed to complete the supply in that state, the "dynamic method" in which the supply start instruction is executed to start photoresist supply while the wafer W is spinning, and the supply stop instruction is executed to complete the supply in that state, and the "stamic method" in which the supply start instruction is executed to start photoresist supply while the wafer W remains still, and the supply stop instruction is executed to complete the supply after the wafer W is started spinning. The "static method" will be described in detail first, and then the "dynamic method" and "stamic method" will be described briefly.

<Static Method>

The coating process provided by this processing program is carried out in the basic sequence set out hereunder.

First, the supply start instruction is executed at a point of time $T_S$ to start supplying the photoresist solution to the wafer W remaining still. At a point of time $T_E$ when the photoresist solution has been supplied in a predetermined fixed quantity and the cylinder sensor 17c is turned on (with the wafer W remaining still), the supply stop instruction is executed to stop supplying the photoresist solution.

Then, at a point of time $t_1$, with some delay (stop time lag $T_{DE}$) after the point of time $T_E$ of execution of the supply stop instruction, the photoresist solution actually stops being delivered from the discharge opening 5a of the treating solution supply nozzle 5. This stoppage point of time is detected by the delivery stop detecting sensor 6, and counting of elapsed time is started at this point of time (timer start).

A spin start instruction is executed at a point of time $t_2$ when a fixed period of time $T_W$ set to the processing program expires, to spin the wafer W with an acceleration to attain a first rotational frequency R1 (e.g. 900 rpm) at a point of time $t_4$. The spin at the first rotational frequency R1 is maintained until a point of time $t_7$, thereby spreading the photoresist solution substantially over the entire surface of wafer W. Subsequently, the spin of wafer W is accelerated to attain a second rotational frequency R2 (e.g. 3,000 rpm) at a point of time $t_8$. With the second rotational frequency R2, the photoresist solution spread substantially over the entire surface of wafer W is spread completely, and a superfluous part of the photoresist solution is dispelled, thereby forming a photoresist film of desired thickness uniformly over the entire surface of wafer W.

During the above process, the photoresist solution scattering in mist may adhere to the back side surface of wafer W, and may flow from the upper surface round to the back side surface of wafer W to adhere to the back side surface. To remove such unwanted part of the photoresist solution, the processing program should preferably include an instruction to deliver the cleaning solution from the back rinse nozzles 11 (see FIG. 2).

Further, the above processing program causes a trigger signal to be outputted to the I/O controller 53 to instruct an image pickup operation a predetermined period of time from the point of time $t_1$ at which the "delivery stop signal" is outputted.

Step S1 (supply start instruction?)

In successively executing the plurality of instructions included in the processing program, the controller 20 selects a course of action by determining whether the instruction is a supply start instruction to deliver the photoresist solution from the treating solution supply nozzle 5. In the "static method", the instruction executed first is the supply start instruction, and the operation proceeds to step S3. In the "dynamic method" described hereinafter, the first instruction is the spin start instruction, and therefore the operation proceeds to step S2 to execute the spin start instruction.

Step S3 (execute supply start instruction)

When the supply start instruction is executed at the point of time $T_S$, the photoresist solution begins to be delivered from the treating solution supply nozzle 5 as follows.

First, the suckback valve 13 is closed to cancel the suction applied to the supply nozzle 5, and one of the valves 18a of the speed control valve assembly 18 also is closed while the other valve 18b is opened. Consequently, the piston 17a of the double-acting air cylinder 17 begins to move upward to actuate the bellows pump 14. In accordance with an operating speed of the bellows pump 14, the photoresist solution is fed from the treating solution tank 16 into the supply pipe 12. However, the moving speed of the piston 17a does not correspond to the speed at which the pressurized air is introduced into the double-acting air cylinder 17 through the speed control valve assembly 18, but depends on the operating speed of the bellows pump 14 corresponding to the pressure loss across the filter F.

Step S4 (cylinder sensor ON?)

Step S4 is repeated until the piston 17a moves to an upper position to be detected by the cylinder sensor 17c. In this example, a fixed quantity of photoresist solution is supplied at a point of time the piston 17a moves upward once to turn on the cylinder sensor 17c. Depending on a required quantity of photoresist solution, the piston 17a has to move up and down repeatedly. In such a case, the number of times the cylinder sensor 17c is turned on may be counted to determine that the required quantity of photoresist solution has been supplied.

Step S5 (execute supply stop instruction)

Assume that, at the point of time $T_E$, the cylinder sensor 17c is turned on as a result of detection of the piston 17a having moved upward. Upon receipt of this information, the controller 20 determines that the fixed quantity of photoresist solution has been supplied, and executes the supply stop instruction to stop the photoresist supply.

When this instruction is executed, the supply of the photoresist solution is stopped as follows.

First, the speed control valve 18a is closed to place the air cylinder 17 in inoperative state. Then the bellows pump 14 stops feeding the photoresist solution. Further, the suckback valve 13 is opened to slightly draw the photoresist solution back from the tip portion of the supply nozzle 5. With this series of operations, the photoresist solution is actually stopped being supplied from the treating solution supply nozzle 5. That is, the delivery of the photoresist solution is stopped with the stop time lag $T_{DE}$ after the point of time $T_E$ of execution of the supply stop instruction. This stop time lag $T_{DE}$ is slightly variable with the pressure of the pressurized air source and the operating speed of the suckback valve 13. In the time chart shown in FIG. 5, the stop time lag $T_{DE}$ is shown longer than an actual value (about 0.1 sec) to facilitate understanding.

Step S6 (delivery stopped?)

After the above supply stop instruction is executed, step S6 is repeated until the delivery stop detecting sensor 6 outputs a "delivery stop signal". That is, execution of a next instruction is prohibited until the photoresist solution delivered from the discharge opening 5a is cut off. Thus, step S6 is repeated during the period of stop time lag $T_{DE}$.

When the "delivery stop signal" is outputted from the delivery stop detecting sensor 6 to the controller 20, the execution of step S6 is terminated, and the operation proceeds to the next step S7. The period from the point of time $T_S$ of execution of the supply start instruction to the point of time $t_1$ of output of the "delivery stop signal" is the time during which the photoresist solution is supplied, and which is a period of time required for supplying the fixed quantity of photoresist solution. This supplying period becomes extended because of the pressure loss across the filter F which increases as days go by. A supplying period $T_{SU}$ is assumed here.

Step S7 (timer start)

In response to the "delivery stop signal", the controller starts the timer at the point of time $t_1$, and waits for elapse of the standby period $T_W$ set to the processing program. Depending on the processing program, the standby period $T_W$ may be set to zero.

Step S8 (output trigger signal)

The controller 20 outputs a trigger signal a predetermined period of time from the point of time $t_1$ at which the timer is started. When this trigger signal is outputted, the delivery stop confirmation unit 50 picks up an image of the surface of wafer W through the I/O controller 53. The operation of the delivery stop confirmation unit 50 when this trigger signal is inputted will be described hereinafter.

Step S9 (execute instructions)

After the various instructions are executed as described above, subsequent instructions are executed successively.

First, a spin start instruction is executed at the point of time $t_2$ when the count by the internal timer not shown indicates expiration of the standby period $T_W$. The wafer W is spun at the first rotational frequency R1 until the point of time $t_7$. Subsequently, at the point of time $t_7$, a spin accelerate instruction is executed, and the wafer W is spun at the second rotational frequency R2 until a point of time $t_{11}$. A spin stop instruction is executed at the point of time $t_{11}$, and the treatment of one wafer W is completed at a point of time $t_{12}$.

As noted above, the supply start instruction is followed by the spin start instruction which is executed in response to the stoppage in the delivery of the fixed quantity of photoresist solution. As a result, the execution timing of the instructions following the supply stop instruction can be made to depend upon the point of time at which the delivery of the photoresist solution is actually stopped. It is therefore possible to fix, to the standby period $T_W$, the period from the point of time $t_1$ at which the delivery of the photoresist solution is actually stopped upon execution of the supply stop instruction until execution of the next instruction (i.e. the spin start instruction).

The case of processing a new wafer W under the condition of an increased pressure loss occurring across the filter F as days go by will be described next.

In this case, even if the double-acting air cylinder 17 is driven with the same condition, the bellows pump 14 feeds the photoresist solution at a reduced flow velocity into the the supply pipe 12. Consequently, an extended time is required to supply the fixed quantity of photoresist solution. It is assumed here that a period $T_{SU1}$ longer than the abovementioned supplying period $T_{SU}$ is required. The points of time for executing instructions during the processing of new wafer W, which are different from the corresponding points of time during the processing described hereinbefore, are shown in parentheses and dotted line arrows in FIG. 5.

In such a case, the supply start instruction is executed at the same point of time $T_S$ as in the preceding processing. However, since the supplying period $T_{SU1}$ longer than the supplying period $T_{SU}$ is required to supply the fixed quantity of photoresist solution, the cylinder sensor is turned on at a point of time ($T_E$) with a corresponding delay. Further, the "delivery stop signal" is outputted to the controller 20 and the timer is started at a point of time ($t_3$) with the same delay. Thus, the spin start instruction is similarly delayed to a point of time ($t_5$). As a result, the period from the point of time ($t_3$) when the "delivery stop signal" is outputted to execution of the spin start instruction corresponds to the standby period $T_W$ in the preceding processing. Therefore, the wafer W may be spun at the first rotational frequency R1 for the same period as in the preceding processing, for spreading the photoresist solution supplied in the fixed quantity, substantially over the entire surface of wafer W. The instructions following the spin start instruction are also executed with the same delay. Specifically, the spin accelerate instruction is delayed from $t_7$ to ($t_9$), and the spin stop instruction from $t_{11}$ to ($t_{13}$). Consequently, the wafer W may be spun at the second rotational frequency R2 for the same period as in the preceding processing, for dispelling the photoresist solution spread over the surface of wafer W. Thus, even if the period of time required to supply the fixed quantity of photoresist solution varies with the pressure loss across the filter F, the intended process may be carried out reliably based on the processing program over a long period of time. This feature is also suited for achievement of photoresist saving to minimize the quantity of photoresist solution supplied.

Further, since the filter F may be changed less frequently, the apparatus is expected to operate at an improved rate.

In the foregoing description, the delay from execution of the supply stop instruction until the delivery is actually stopped is fixed to the stop time lag $T_{DE}$. As noted hereinbefore, this value also is variable with adjustment of the suck-back valve 13 and the pressure of the pressurized air source. However, the variations may be absorbed as a natural result since the next instruction is executed based on detection of the delivery stoppage as described above. Thus, the process may be performed accurately by the processing program even when the pressure of the pressurized air source falls due to increased use thereof by other apparatus or when the above variations result in variations in the stop time lag $T_{DE}$.

Next, the operation of delivery stop confirmation unit 50 when the trigger signal is outputted at the above step S8 will be described with reference to the flow chart shown in FIG. 7.

Step T1 (pick up wafer surface image)

When the trigger signal is inputted, the I/O controller 53 controls the CCD camera 30 through the camera controller 52 to pick up an image in the field of view noted hereinbefore. That is, an image is picked up of the surface of wafer W including the space between the discharge opening 5a of treating solution supply nozzle 5 and the surface of wafer W. The image signals obtained are outputted to the image processor 54 through the I/O controller 53.

Step T2 (store still picture).

The image signals are stored in image memory 55 as a still picture. The still picture stored in the image memory 55 is only the image picked up in response to the trigger signal and, therefore, the storage capacity of image memory 55 may be sufficient if at least this image can be stored. To reduce the storage capacity, the image may be subjected to a binary-coding process or the like at the image processor 54 before storage in the image memory 55.

Step T3 (output still picture to monitor)

The image processor 54 fetches the still picture stored in the image memory 55, and outputs it to the monitor 59 through the I/O controller 53.

In this way, the image is picked up of the surface of wafer W in response to the "delivery stop signal", and the still picture thereby obtained is outputted to the monitor 59. By observing the still picture, the operator may determine whether the timing of determining the delivery stoppage is appropriate or not. When the timing is found inappropriate, the operator has only to stop the apparatus manually. In the event of malfunctioning of the delivery stop detecting sensor 6 due to adhesion of mist or the like, for example, the execution of instructions will be mistimed to perform an improper process. Then, the operator may manually stop the apparatus to preclude the improper process from being applied to wafers.

In the apparatus described above, the delivery stop sensor 6 (delivery stop detecting device) comprises an optical sensor. Instead, the delivery stoppage may be detected by a CCD camera having a field of view set to an area adjacent the discharge opening 5a.

<Dynamic Method>

Next, a coating process by the processing program employing the dynamic method will be described with reference to the time chart shown in FIG. 8. In the dynamic method, the photoresist solution is started being supplied to the wafer W in a spin, and the photoresist supply is completed in that state. The time chart of FIG. 8 shows the operation based on the trigger signal, labeling in parentheses and dotted line arrows which have the same meanings as those described hereinbefore.

In this dynamic method, the supply start instruction is executed at a point of time $T_S$ to start supplying the photoresist solution, while spinning the wafer W at the first rotational frequency R1. The supply stop instruction is executed at a point of time $T_E$ to complete supplying the photoresist solution while maintaining the spin at the first rotational frequency R1.

In the coating process by the dynamic method, the supply stop instruction is followed by the spin accelerate instruction which is executed in response to a stoppage in the delivery of the photoresist solution. Thus, as in the static method described hereinbefore, the period between execution of these instructions may be fixed to the standby period $T_W$ even if the supplying period $T_{SU}$ is extended to the supplying period $T_{SU1}$. It is therefore possible to fix the period from the point of time at which the delivery of the photoresist solution is stopped until the point of time for accelerating the spin to the second rotational frequency R2. The period for dispelling the photoresist solution by the spin at the second rotational frequency R2 may also be fixed. Thus, the intended process may be carried out accurately based on the processing program over a long period of time, to provide advantages similar to those of the static method.

<Stamic Method>

Next, a coating process by the processing program employing the stamic method will be described with reference to the time chart shown in FIG. 9. In the stamic method, the photoresist solution is started being supplied to the wafer W remaining still, and the photoresist supply is completed after the wafer is started spinning.

In this stamic method, the supply start instruction is executed at a point of time $T_S$ to start supplying the photoresist solution when the rotational frequency of wafer W is zero, i.e. while the wafer remains stationary. The supply stop instruction is executed at a point of time $T_E$, after a point of time $t_1$ for executing the spin start instruction, to stop supplying the photoresist solution.

In the coating process by the stamic method, the supply stop instruction is followed by the spin accelerate instruction which is executed in response to a stoppage in the delivery of the photoresist solution. Thus, as in the static method and dynamic method described hereinbefore, the period between execution of these instructions may be fixed to the standby period $T_W$ even if the supplying period $T_{SU}$ is extended to the supplying period $T_{SU1}$. It is therefore possible to fix the period from the point of time at which the delivery of the photoresist solution is stopped until the point of time for accelerating the spin to the second rotational frequency R2. The period for dispelling the photoresist solution by the spin at the second rotational frequency R2 may also be fixed. Thus, the intended process may be carried out accurately based on the processing program over a long period of time, to provide advantages similar to those of the preceding supplying methods.

<Preferred Coating Method>

An example of coating method will be described, which may be executed with the apparatus for carrying out the intended process by the processing program accurately over a long period of time as described hereinbefore. The following description will be made, exemplifying the static method as the method of supplying the photoresist solution.

In the process based on the processing program shown in the time chart of FIG. 5 described hereinbefore, a photoresist film is formed as a result of a behavior of photoresist solution R as schematically shown in FIGS. 10A through 10F. In these figures, wafer W is shown in circles and photoresist solution R in hatched regions, for simplicity of illustration. The varied rotational frequencies of wafer W are schematically indicated by different sizes of arrows.

Figure 10A:
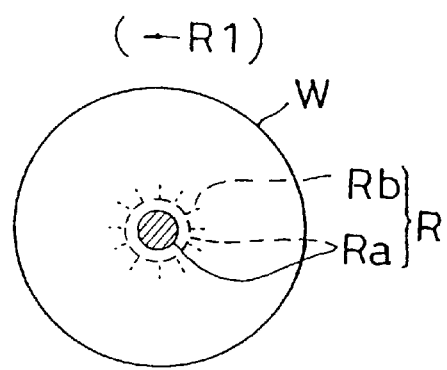
FIGS. 10A, 10B, 10C, 10D, 10E and 10F are schematic views showing a behavior of a photoresist solution.

Immediately after the photoresist solution R begins to be supplied to the surface of wafer W, as shown in FIG. 10A, the photoresist solution R is present around the center of wafer W in the form of a drop Ra circular in plan view (which is hereinafter referred to as core Ra). As photoresist solution R continues to be supplied for the supplying period $T_{SU}$, the core Ra spreads radially and concentrically by gravity (as shown in dotted lines in FIG. 10A).

Figure 10B:
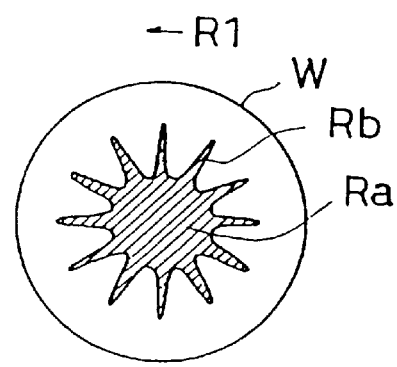

Subsequently, the supply of photoresist solution R is stopped and the wafer W begins to be spun at the rotational frequency R1. Then, the core Ra retains the circular shape and enlarges its radius for a while, and thereafter undergoes conspicuous changes in shape. That is, the photoresist solution R begins to flow in a plurality of rivulets Rb (hereinafter referred to as fingers Rb) extending radially from the edge of core Ra (as shown in dotted lines in FIG. 10A). These numerous fingers Rb, by the centrifugal force generated by the spin at the rotational frequency RI, continue to grow toward the edge of wafer W with an increase in the diameter of core Ra. The fingers Rb grow toward the edge of wafer W faster than the enlargement of core Ra (FIG. 10B).

Figure 10C:
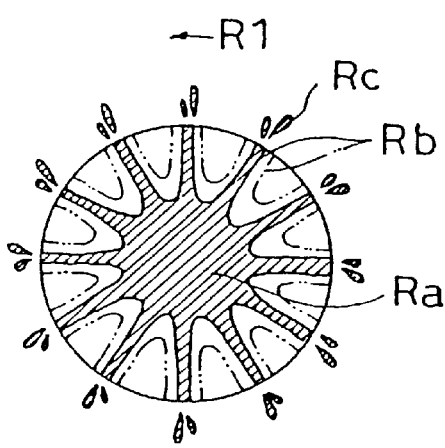
Figure 10D:
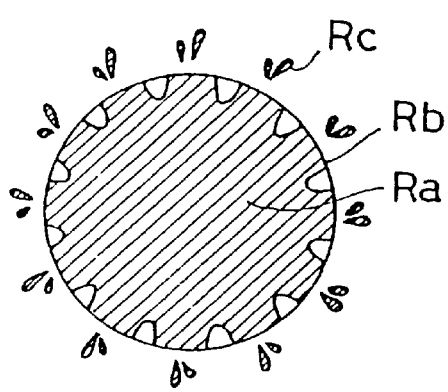
Figure 10E:
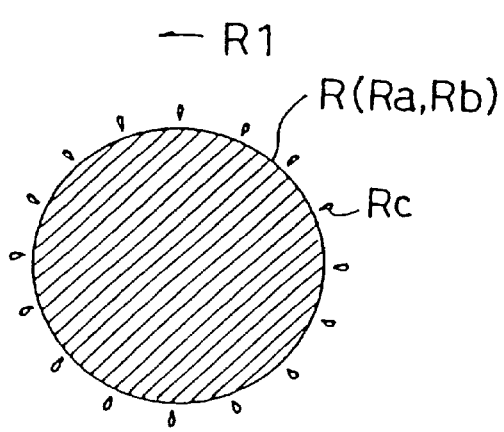
Figure 10F:
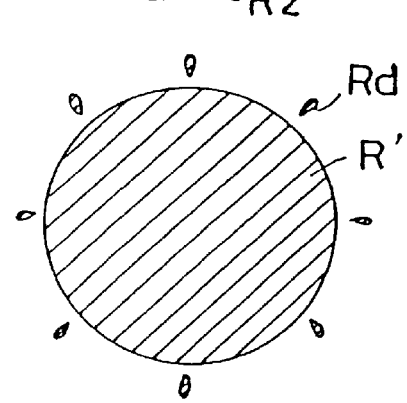

As the wafer W continues to spin at the same rotational frequency R1, leading ends of fingers Rb reach the edge of wafer W (FIG. 10C). With the fingers Rb having reached the edge of wafer W, the photoresist solution R flows through the fingers Rb to the edge of wafer W to be scattered away (in scattering photoresist solution Rc). As the diameter of the core Ra increases further, the fingers Rb become broader (as shown in two-dot-and-dash lines in FIG. 10C; and FIG. 10D). As a result, regions between the fingers Rb gradually diminish, until finally the entire surface of wafer W is covered by the photoresist solution R (core Ra and fingers Rb) (FIG. 10E).

After the entire surface of wafer W is covered with the photoresist solution R as above, the rotational frequency of wafer W is increased from the rotational frequency R1 to the faster rotational frequency R2. A superfluous part of photoresist solution R covering the surface of wafer W is dispelled (as excess photoresist solution Rd), thereby forming a photoresist film R' in a desired thickness on the surface of wafer W.

However, when the numerous fingers Rb reach the edge of wafer W, as shown in FIG. 10C, a large part of photoresist solution R supplied to the surface of wafer W flows through the fingers Rb to be cast off to the ambient (as scattering photoresist solution Rc). In order to cover the entire surface of wafer W with the photoresist solution R, it is necessary to take the quantity of scattering photoresist solution Rc into account, and supply a large quantity of photoresist solution R, leading to an excessive consumption of photoresist solution R.

Figure 11:
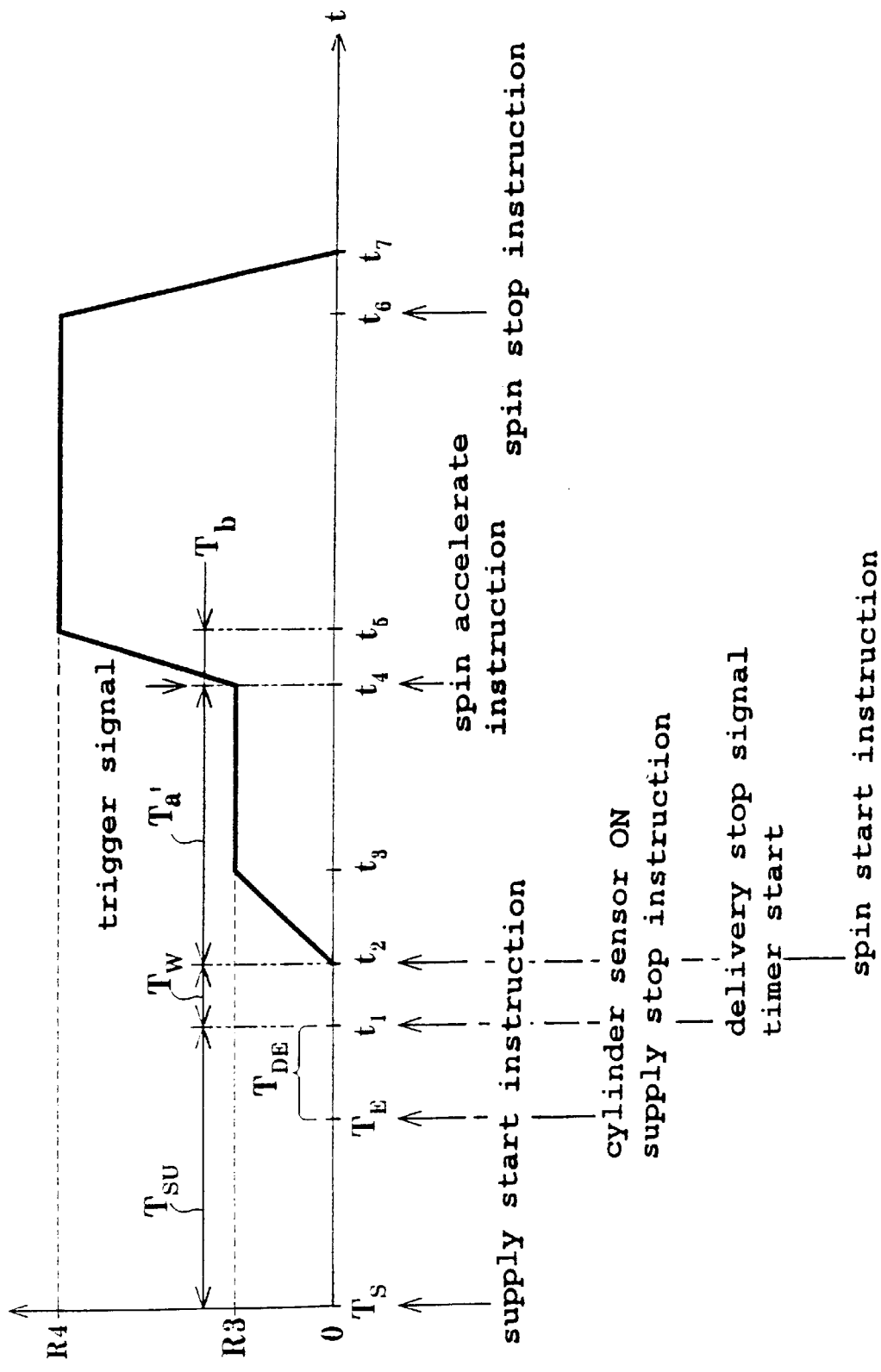
FIG. 11 is a time chart showing a preferred coating program suited to the apparatus according to this invention and based on the static method.

To avoid the above situation, as shown in the time chart of FIG. 11, the wafer W is started spinning at a point of time $t_2$, after completing the supply of photoresist solution R, to attain a first rotational frequency R3 (e.g. 1,000 rpm). Then, the rotational frequency of wafer W is increased within a period of time Ta' (e.g. 0.1 to 0.3 sec., which is hereinafter referred to as the rotational frequency switch starting period) of the point of time $t_2$. The rotational frequency switch starting period Ta' is set to be within a period of time (e.g. approximately 0.5 sec.) for the fingers Ra to be extended by the first rotational frequency R3 to reach the edge of wafer W.

Figure 12:
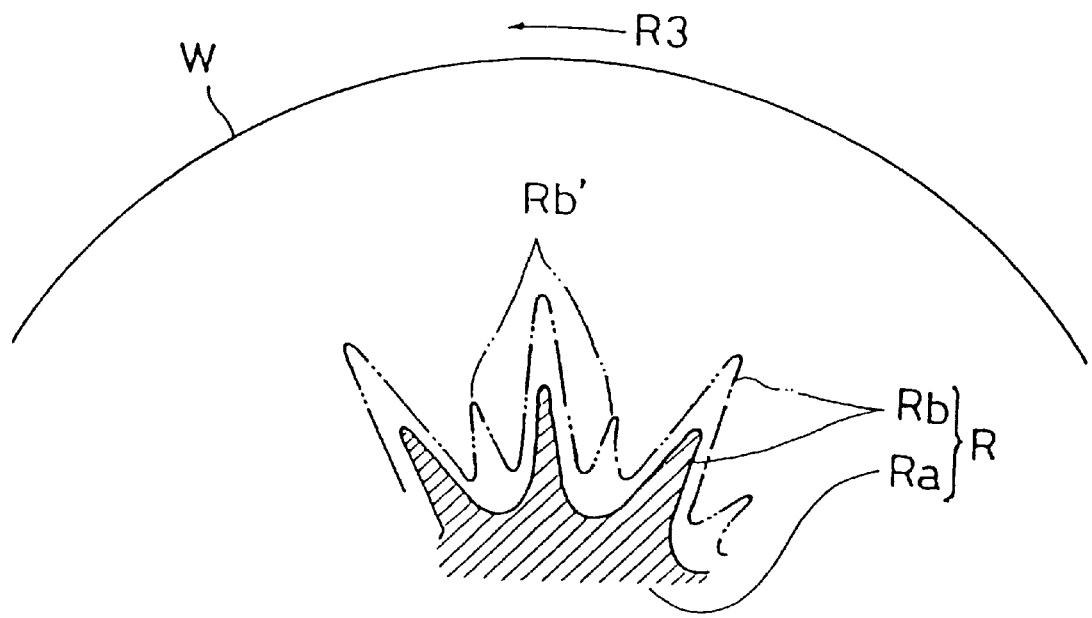
FIG. 12 is a schematic view showing a behavior of the photoresist solution based on the preferred coating program.

At this stage, the core Ra retains the circular shape for a while and thereafter, as shown in FIG. 12, new radial rivulets Rb' (hereinafter referred to as new fingers Rb') of photoresist solution R develop from the core Ra. These new fingers Rb' (in a two-dot-and-dash line in FIG. 12) begin to extend from between the numerous fingers Rb toward the edge of wafer W. Further, before the photoresist solution R covers the entire surface of wafer W, the rotational frequency of wafer W is increased to a second rotational frequency R4 (e.g. 3,000 rpm). This rotational frequency switching is made in a period of time Tb which preferably is approximately 0.07 sec.

Figure 13:
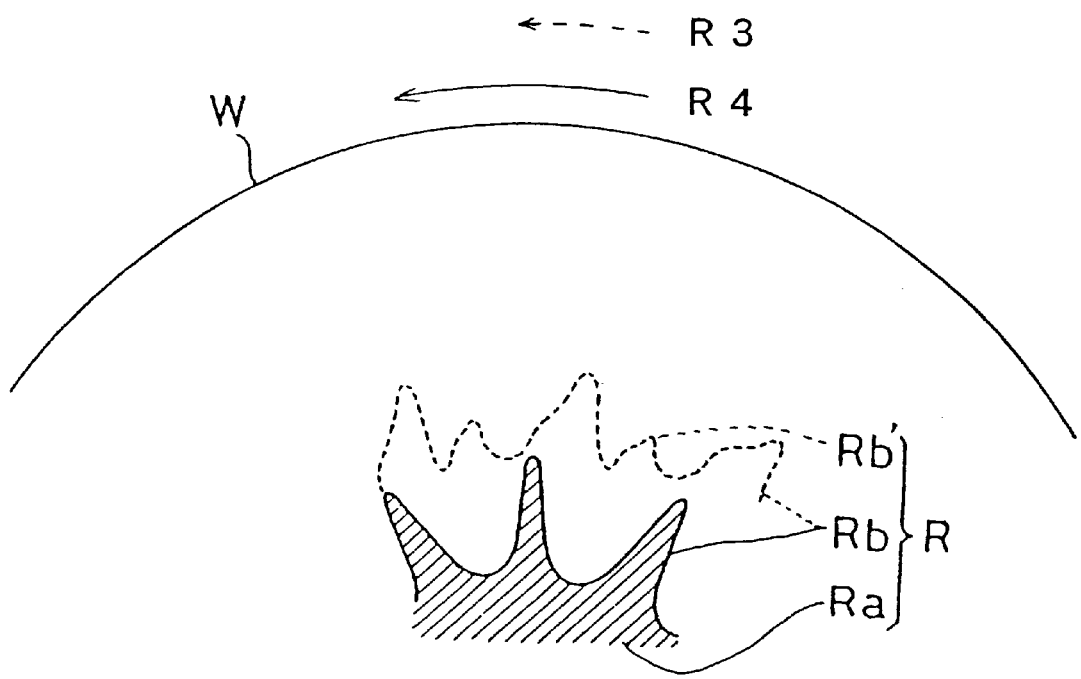
FIG. 13 is a schematic view showing the behavior of the photoresist solution based on the preferred coating program.

By rapidly increasing the rotational frequency of wafer W from the first rotational frequency R3 to the second rotational frequency R4 within the rotational frequency switching period Tb, the fingers Rb and new fingers Rb' are subjected to a force of inertia, i.e. a force acting in the direction opposite to the direction of spin (indicated by an arrow in FIG. 12). The resultant of centrifugal force and inertia causes the fingers Rb and new fingers Rb', which would otherwise grow linearly toward the edge of wafer W, to grow in directions curved circumferentially, thereby enlarging widths thereof, as shown in FIG. 13. The leading ends of the fingers Rb and new fingers Rb' extend under the centrifugal force toward the edge of wafer W. The diameter of core Ra increases also.

As described above, after the photoresist solution R is supplied to the wafer W standing still, the wafer W is spun at the first rotational frequency R3. After the rotational frequency switch starting period Ta' from the point of time $t_2$ for starting the spin of wafer W, the rotational frequency begins to be increased to the second rotational frequency R4 higher than the first rotational frequency R3. This acceleration is completed within the short rotational frequency switching period Tb. The above sequence achieves a drastic reduction in the required coating time. Thus, a reduced time is taken from arrival of fingers Rb and new fingers Rb' at the edge of wafer W to stopping of the supply of photoresist solution R. A reduced quantity of photoresist solution R is discarded through the fingers Rb and new fingers away from the wafer W. As a result, a photoresist film R' of desired thickness may be formed by a drastically reduced supply of photoresist solution R.

Experiment was conducted, using 8-inch wafers, and employing i-Line Resist PFI manufactured by Sumitomo Kagaku Kogyo K.K. as photoresist solution. In the experment, the rotational frequency was increased from the first rotational frequency R3 to the second rotational frequency R4 in varied periods of time (i.e. acceleration periods Tb or acceleration of the spin; see FIG. 11). It has been found as a result that an acceleration period Tb in the range of 0.03 to 0.2 sec. can achieve a reduction in the coating time needed. That is, the rotational frequency of wafer W should preferably be increased rapidly (for a reduced acceleration period Tb) to shorten the coating time. It has also been found, however, that if the acceleration is too rapid, a long time is consumed in coating, thereby increasing the unnecessary quantity of photoresist solution. It is considered due to the behavior of the photoresist solution described hereunder that a long coating time is needed when acceleration time is too short, i.e. when the acceleration of the spin is too rapid.

The fingers Rb extending from the core Ra toward the edge of wafer W are scattered away from the surface of wafer W by rapid acceleration. It is also conceivable that the fingers Rb are once bent circumferentially, but thereafter grow linearly toward the edge of wafer W, by centrifugal force, with the widths of the fingers Rb increasing circumferentially only to limited extents.

Various experiments have shown that a preferred range of spin acceleration in increasing the rotational frequency from the first rotational frequency R3 to the second rotational frequency R4 is from 7,500 rpm/sec to 50,000 rpm/sec. That is, with the above conditions, such as the wafer size and the type of photoresist solution, a preferred range of spin acceleration is 7,500 to 50,000 rpm/sec for increasing the rotational frequency to the second rotational frequency R4.

The rotational frequency of wafer W is controlled as described above. According to the conventional method, the supplying period $T_{SU}$ varies, which in turn varies the rotational frequency switch starting time Ta. Thus, the shape of photoresist solution R is varied at the point of time for accelerating the spin. This results in the inconvenience that the coating loses uniformity as days go by.

According to this invention, on the other hand, such an inconvenience may be avoided since the processing program may be prepared accurately despite variations in the supplying period $T_{SU}$ occurring with passage of days. Thus, the intended process may be carried out accurately based on the processing program over a long period of time, while minimizing the quantity of photoresist solution supplied to form a film of desired thickness. As a result, the manufacturing cost of semiconductor devices is reduced through photoresist saving.

In the above coating method, preferably, a trigger signal is outputted at a point of time $t_4$ in FIG. 11 for executing the spin accelerate instruction, in order to pick up an image of the shape of the photoresist solution at the acceleration point of time. This enables a confirmation of proper timing, and facilitates a determination whether the process is being performed properly or not.

In the dynamic method and stamic method also, a force of inertia may be applied to the fingers Rb as in the static method described above.

In the foregoing description, the photoresist solution is used as one example of coating solutions. Instead, the coating solution may be SOG (Spin On Glass) solution or polyimide resin used for surface protection or insulation.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method of supplying a treating solution to a substrate in a spin coating process based on a prestored processing program with a plurality of instructions including a supply start instruction and a supply stop instruction for performing a series of processes, said method comprising the steps of:
   (a) executing said supply start instruction to supply said treating solution to a central region of a substrate;
   (b) executing said supply stop instruction to stop supplying said treating solution when said treating solution has been supplied in a fixed quantity;
   (c) confirming an actual stoppage in delivering said treating solution following execution of said supply stop instruction; and
   (d) executing subsequent instructions in said processing program in response to an actual stoppage in delivering said treating solution following execution of said supply stop instruction.

2. A method as defined in claim 1, wherein the steps (a) and (b) are executed while said substrate is maintained stationary.

3. A method as defined in claim 2, wherein a spin accelerate instruction included in said processing program is executed to increase rotational frequency of said substrate before said treating solution, supplied at the steps (a) and (b), spreads in a substantially circular shape to cover an entire surface of said substrate as a result of a spin caused by execution of a spin start instruction included in said processing program.

4. A method as defined in claim 3, wherein said rotational frequency is increased by a spin acceleration in a range of 7,500 to 50,000 rpm/sec.

5. A method as defined in claim 1, wherein the steps (a) and (b) are executed while said substrate is spun by execution of a spin start instruction included in said processing program.

6. A method as defined in claim 5, wherein a spin accelerate instruction included in said processing program is executed to increase rotational frequency of said substrate before said treating solution, supplied at the steps (a) and (b), spreads in a substantially circular shape to cover an entire surface of said substrate as a result of a spin caused by execution of a spin start instruction included in said processing program.

7. A method as defined in claim 6, wherein said rotational frequency is increased by a spin acceleration in a range of 7,500 to 50,000 rpm/sec.

8. A method as defined in claim 1, wherein the step (a) is executed while said substrate is maintained stationary, and the step (b) is executed after said substrate is started spinning by execution of a spin start instruction included in said processing program.

9. A method as defined in claim 8, wherein a spin accelerate instruction included in said processing program is executed to increase rotational frequency of said substrate before said treating solution, supplied at the steps (a) and (b), spreads in a substantially circular shape to cover an entire surface of said substrate as a result of a spin caused by execution of a spin start instruction included in said processing program.

10. A method as defined in claim 9, wherein said rotational frequency is increased by a spin acceleration in a range of 7,500 to 50,000 rpm/sec.

11. A method as defined in claim 1, wherein a spin accelerate instruction included in said processing program is executed to increase rotational frequency of said substrate before said treating solution, supplied at the steps (a) and (b), spreads in a substantially circular shape to cover an entire surface of said substrate as a result of a spin caused by execution of a spin start instruction included in said processing program.

12. A method as defined in claim 11, wherein said rotational frequency is increased by a spin acceleration in a range of 7,500 to 50,000 rpm/sec.

13. An apparatus for supplying a treating solution based on a prestored processing program with a plurality of instructions including a supply start instruction and a supply stop instruction for performing a series of processes, said apparatus comprising:
   rotary support means for supporting and spinning a substrate;
   treating solution supply means for supplying said treating solution to said substrate;
   delivery stop detecting means for detecting an actual stoppage in delivering said treating solution from said treating solution supply means; and
   control means for executing said supply start instruction to supply said treating solution from said treating solution supply means to a central region of said substrate, executing said supply stop instruction to stop supplying said treating solution when said treating solution has been supplied in a fixed quantity, and executing subsequent instructions in response to a detection by said delivery stop detecting means of a stoppage in delivering said treating solution.

14. An apparatus as defined in claim 13, wherein said control means is operable to start and stop supplying said treating solution while maintaining said substrate stationary.

15. An apparatus as defined in claim 14, wherein said control means is operable to execute a spin accelerate instruction included in said processing program to increase rotational frequency of said substrate before said treating solution, supplied to a surface of said substrate, spreads in a substantially circular shape to cover an entire surface of said substrate as a result of a spin caused by execution of a spin start instruction included in said processing program.

16. An apparatus as defined in claim 13, wherein said control means is operable to start and stop supplying said treating solution while spinning said substrate.

17. An apparatus as defined in claim 16, wherein said control means is operable to execute a spin accelerate instruction included in said processing program to increase rotational frequency of said substrate before said treating solution, supplied to a surface of said substrate, spreads in a substantially circular shape to cover an entire surface of said substrate as a result of a spin caused by execution of a spin start instruction included in said processing program.

18. An apparatus as defined in claim 13, wherein said control means is operable to start supplying said treating solution while maintaining said substrate stationary, and to stop supplying said treating solution while spinning said substrate.

19. An apparatus as defined in claim 18, wherein said control means is operable to execute a spin accelerate instruction included in said processing program to increase rotational frequency of said substrate before said treating solution, supplied to a surface of said substrate, spreads in a substantially circular shape to cover an entire surface of said substrate as a result of a spin caused by execution of a spin start instruction included in said processing program.

20. An apparatus as defined in claim 13, wherein said control means is operable to execute a spin accelerate instruction included in said processing program to increase rotational frequency of said substrate before said treating solution, supplied to a surface of said substrate, spreads in a substantially circular shape to cover an entire surface of said substrate as a result of a spin caused by execution of a spin start instruction included in said processing program.

21. An apparatus for supplying a treating solution based on a prestored processing program with a plurality of instructions including a supply start instruction and a supply stop instruction for performing a series of processes, said apparatus comprising:

a rotary support supporting and spinning a substrate;

a treating solution supply supplying said treating solution to said substrate;

a delivery stop detecting device detecting an actual stoppage in delivering said treating solution from said treating solution supply; and a controller executing said supply start instruction to supply said treating solution from said treating solution supply to a central region of said substrate, executing said supply stop instruction to stop supplying said treating solution when said treating solution has been supplied in a fixed quantity, and executing subsequent instructions in response to a detection by said delivery stop detecting device of a stoppage in delivering said treating solution.

22. An apparatus as defined in claim 21, wherein said controller is operable to start and stop supplying said treating solution while maintaining said substrate stationary.

23. An apparatus as defined in claim 22, wherein said controller is operable to execute a spin accelerate instruction included in said processing program to increase rotational frequency of said substrate before said treating solution, supplied to a surface of said substrate, spreads in a substantially circular shape to cover an entire surface of said substrate as a result of a spin caused by execution of a spin start instruction included in said processing program.

24. An apparatus as defined in claim 21, wherein said controller is operable to start and stop supplying said treating solution while spinning said substrate.

25. An apparatus as defined in claim 24, wherein said controller is operable to execute a spin accelerate instruction included in said processing program to increase rotational frequency of said substrate before said treating solution, supplied to a surface of said substrate, spreads in a substantially circular shape to cover an entire surface of said substrate as a result of a spin caused by execution of a spin start instruction included in said processing program.

26. An apparatus as defined in claim 21, wherein said controller is operable to start supplying said treating solution while maintaining said substrate stationary, and to stop supplying said treating solution while spinning said substrate.

27. An apparatus as defined in claim 26, wherein said controller is operable to execute a spin accelerate instruction included in said processing program to increase rotational frequency of said substrate before said treating solution, supplied to a surface of said substrate, spreads in a substantially circular shape to cover an entire surface of said substrate as a result of a spin caused by execution of a spin start instruction included in said processing program.

28. An apparatus as defined in claim 21, wherein said controller is operable to execute a spin accelerate instruction included in said processing program to increase rotational frequency of said substrate before said treating solution, supplied to a surface of said substrate, spreads in a substantially circular shape to cover an entire surface of said substrate as a result of a spin caused by execution of a spin start instruction included in said processing program.

* * * * *